United States Patent
Chiang et al.

(10) Patent No.: US 8,994,156 B2
(45) Date of Patent: *Mar. 31, 2015

(54) SEMICONDUCTOR DEVICE PACKAGES WITH SOLDER JOINT ENHANCEMENT ELEMENTS

(71) Applicant: Advanced Semiconductor Engineering, Inc., Kaohsiung (TW)

(72) Inventors: Po-Shing Chiang, Kaohsiung (TW); Ping-Cheng Hu, Kaohsiung (TW); Yu-Fang Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,328

(22) Filed: Jul. 29, 2013

(65) Prior Publication Data

US 2013/0307157 A1 Nov. 21, 2013

Related U.S. Application Data

(63) Continuation of application No. 13/433,061, filed on Mar. 28, 2012, now Pat. No. 8,502,363.

(30) Foreign Application Priority Data

Jul. 6, 2011 (TW) .............................. 100123897 A

(51) Int. Cl.
*H01L 23/495* (2006.01)
*H01L 21/00* (2006.01)
(Continued)

(52) U.S. Cl.
CPC .............. *H01L 23/488* (2013.01); *H01L 24/49* (2013.01); *H01L 21/56* (2013.01);
(Continued)

(58) Field of Classification Search
CPC ..................... H01L 2224/85; H01L 23/49575; H01L 24/48; H01L 21/56; H01L 23/49541; H01L 24/49; H01L 24/06; H01L 23/49582; H01L 21/4832; H01L 23/488; H01L 2224/48091; H01L 2224/48247

See application file for complete search history.

(56) References Cited

U.S. PATENT DOCUMENTS 5,847,458 A 12/1998 Nakamura et al.
6,001,671 A 12/1999 Fjelstad
(Continued)

FOREIGN PATENT DOCUMENTS

CN 101442035 5/2009
CN 101540309 9/2009
(Continued)

OTHER PUBLICATIONS

Lai et al.; "Development and performance charaterizations of a QFN/HMT package"; Electronic Components and Technology Conference; pp. 964-967 (2008).

(Continued)

*Primary Examiner* — Alonzo Chambliss
(74) *Attorney, Agent, or Firm* — Klein, O'Neill & Singh, LLP

(57) ABSTRACT

Electronic devices including a semiconductor device package, a substrate, and first and second solder joints. The semiconductor device package includes a die pad, leads and enhancement elements surrounding the die pad, a chip electrically connected to the leads, and a package body encapsulating the chip, portions of the leads, and portions of the enhancement elements, but leaving exposed at least a side surface of each enhancement element. Side surfaces of the enhancement elements and the package body are coplanar. The substrate includes first pads corresponding to the leads and second pads corresponding to the enhancement elements. The first solder joints are disposed between the first pads and the leads. The second solder joints are disposed between the second pads and the enhancement elements. The second solder joints contact side surfaces of the enhancement elements. The surface area of the second pads is greater than the surface area of the corresponding enhancement elements.

16 Claims, 6 Drawing Sheets

(51) Int. Cl.
*H05K 5/02* (2006.01)
*H01L 23/488* (2006.01)
*H01L 23/00* (2006.01)
*H01L 21/48* (2006.01)
*H01L 21/56* (2006.01)

(52) U.S. Cl.
CPC ... *H01L 23/49541* (2013.01); *H01L 23/49582* (2013.01); *H01L 21/4832* (2013.01); *H01L 24/48* (2013.01); *H01L 2224/48091* (2013.01); *H01L 2224/48247* (2013.01); *H01L 2924/00014* (2013.01)
USPC ........... 257/672; 257/673; 257/676; 257/687; 257/693; 438/113; 438/123; 438/124; 438/127; 438/613; 361/813

(56) References Cited

U.S. PATENT DOCUMENTS

| | | | |
|---|---|---|---|
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,306,685 B1 | 10/2001 | Liu et al. | |
| 6,312,974 B1 * | 11/2001 | Wu et al. | 438/107 |
| 6,333,252 B1 | 12/2001 | Jung et al. | |
| 6,342,730 B1 | 1/2002 | Jung et al. | |
| 6,348,726 B1 | 2/2002 | Bayan et al. | |
| 6,400,004 B1 | 6/2002 | Fan et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,528,893 B2 | 3/2003 | Jung et al. | |
| 6,534,330 B2 | 3/2003 | Sakamoto et al. | |
| 6,545,347 B2 | 4/2003 | McClellan | |
| 6,586,677 B2 | 7/2003 | Glenn | |
| 6,658,734 B2 | 12/2003 | Yamada et al. | |
| 6,664,615 B1 | 12/2003 | Bayan et al. | |
| 6,700,188 B2 | 3/2004 | Lin | |
| 6,812,552 B2 | 11/2004 | Islam et al. | |
| 6,861,295 B2 | 3/2005 | Jung et al. | |
| 6,927,096 B2 | 8/2005 | Shimanuki | |
| 6,927,483 B1 * | 8/2005 | Lee et al. | 257/676 |
| 6,993,594 B2 | 1/2006 | Schneider | |
| 6,995,459 B2 | 2/2006 | Lee et al. | |
| 7,049,177 B1 | 5/2006 | Fan et al. | |
| 7,060,535 B1 * | 6/2006 | Sirinorakul et al. | 438/123 |
| 7,183,630 B1 | 2/2007 | Fogelson et al. | |
| 7,247,526 B1 | 7/2007 | Fan et al. | |
| 7,271,032 B1 | 9/2007 | McLellan et al. | |
| 7,608,930 B2 | 10/2009 | Kasuya et al. | |
| 7,683,461 B2 * | 3/2010 | Lau | 257/666 |
| 7,807,498 B2 | 10/2010 | Shoji et al. | |
| 8,076,787 B2 | 12/2011 | Hayashi | |
| 8,115,825 B2 | 2/2012 | Culbert et al. | |
| 8,120,152 B2 | 2/2012 | Chang Chien et al. | |
| 8,377,750 B2 | 2/2013 | Camacho et al. | |
| 8,492,883 B2 | 7/2013 | Chien et al. | |
| 8,502,363 B2 * | 8/2013 | Chiang et al. | 257/676 |
| 2003/0006055 A1 | 1/2003 | Chien-Hung et al. | |
| 2003/0025201 A1 | 2/2003 | Harada | |
| 2005/0247944 A1 | 11/2005 | Haque et al. | |
| 2007/0018291 A1 | 1/2007 | Huang et al. | |
| 2007/0052076 A1 | 3/2007 | Ramos et al. | |
| 2007/0059863 A1 | 3/2007 | Li et al. | |
| 2007/0085199 A1 | 4/2007 | Ong et al. | |
| 2007/0181983 A1 | 8/2007 | Takai et al. | |
| 2008/0067649 A1 | 3/2008 | Matsunaga et al. | |
| 2008/0258278 A1 | 10/2008 | Ramos et al. | |
| 2009/0230524 A1 | 9/2009 | Chien et al. | |
| 2010/0044843 A1 | 2/2010 | Chang Chien et al. | |
| 2010/0290202 A1 | 11/2010 | Sasaki et al. | |
| 2011/0079885 A1 * | 4/2011 | Camacho et al. | 257/676 |
| 2011/0108966 A1 * | 5/2011 | Bathan et al. | 257/676 |

FOREIGN PATENT DOCUMENTS

| | | |
|---|---|---|
| CN | 101694837 | 4/2010 |
| CN | 102044510 | 5/2011 |
| JP | 5166985 | 7/1993 |
| JP | 11195733 | 7/1999 |
| JP | 2001024135 | 1/2001 |
| TW | 423135 | 2/2001 |
| WO | WO2007/074601 | 7/2007 |

OTHER PUBLICATIONS

Search Report from TW Patent Office on co-pending TW application (101123905) dated Aug. 13, 2014.

* cited by examiner

SEMICONDUCTOR DEVICE PACKAGES WITH SOLDER JOINT ENHANCEMENT ELEMENTS

CROSS-REFERENCE TO RELATED APPLICATIONS

This application is a continuation of co-pending U.S. patent application Ser. No. 13/433,061, filed on Mar. 28, 2012, which claims priority to Taiwan Patent Application Serial No. 100123897, filed on Jul. 6, 2011. The priority applications are incorporated herein by reference in their entireties.

BACKGROUND

The present embodiments relate to semiconductor device packages, and more particularly to semiconductor device packages having a lead frame and related manufacturing methods.

DESCRIPTION OF RELATED ART

A quad-flat no-leads (QFN) package is a type of semiconductor device package having short signal traces and, thus, fast signal transmission speed. Therefore, QFN packages are well suited to chip packages with high frequency transmission (e.g. high frequency transmission through the RF bandwidth), and have become common for package applications in the wireless field, for example.

In one method of making a conventional QFN package, a lead frame having die pads and leads is provided. Chips, or dies, are configured on the die pads and electrically connected to the leads via bonding wires. The leads, the bonding wires, and the chips are encapsulated and protected by a molding compound, or encapsulant, and the bottom surfaces of the leads are exposed from the encapsulant for electrical connection to an external device, such as a printed circuit board (PCB). A singulation process is then performed to divide the structure into individual QFN packages.

After PCB surface mount, a drop test may be performed to evaluate solder joint reliability between the QFN package and the PCB. During the drop test, the solder joint is usually broken at the corners of the QFN package. Therefore, there is a need to improve the solder joint strength at the corners.

SUMMARY

One of the present embodiments comprises an electronic device. The electronic device comprises a semiconductor device package. The semiconductor device package includes a die pad, a plurality of leads disposed about the die pad, and a plurality of enhancement elements disposed about the die pad. Each of the enhancement elements has a substantially triangular outer surface and three side surfaces. The semiconductor device package further includes a chip disposed on the die pad and electrically connected to the leads, and a package body encapsulating the chip, at least portions of the leads and at least portions of the enhancement elements, but leaving exposed at least two of the side surfaces of each enhancement element. The exposed side surfaces of the enhancement elements are coplanar with side surfaces of the package body. The electronic device further comprises a substrate including a plurality of first pads corresponding to the leads and a plurality of second pads corresponding to the enhancement elements. The electronic device further comprises a plurality of first solder joints disposed between the first pads and the leads. The electronic device further comprises a plurality of second solder joints disposed between the second pads and the enhancement elements. A surface area of each of the second pads is larger than a surface area of a corresponding one of the enhancement elements. The second solder joints contact the side surfaces of the enhancement elements.

Another of the present embodiments comprises an electronic device. The electronic device comprises a semiconductor device package. The semiconductor device package includes a die pad and a plurality of leads disposed about the die pad. The semiconductor device package further includes a plurality of enhancement elements disposed symmetrically about the die pad. Each enhancement element including substantially rectangular inner and outer surfaces. The semiconductor device package further includes a chip disposed on the die pad and electrically connected to the leads, and a package body encapsulating the chip, at least portions of the leads and at least portions of the enhancement elements, but leaving exposed at least one side surface of each enhancement element. The exposed side surfaces of the enhancement elements are coplanar with side surfaces of the package body. The electronic device further comprises a substrate including a plurality of first pads corresponding to the leads and a plurality of second pads corresponding to the enhancement elements. The electronic device further comprises a plurality of first solder joints disposed between the first pads and the leads. The electronic device further comprises a plurality of second solder joints disposed between the second pads and the enhancement elements. The enhancement elements include first enhancement elements disposed at corners of the package body and second enhancement elements disposed at a center of each edge of the package body. The second solder joints contact the side surfaces of the enhancement elements.

Another of the present embodiments comprises a method of manufacturing an electronic device. The method comprises providing a semiconductor device package. The semiconductor device package comprises a die pad, a plurality of leads surrounding the die pad, and a plurality of enhancement elements surrounding the die pad. The semiconductor device package further comprises a chip disposed on the die pad and electrically connected to the leads, and a package body encapsulating the chip, portions of the leads and portions of the enhancement elements, but leaving exposed at least a side surface of each enhancement element. The side surface of each enhancement element is coplanar to the side surface of the package body. The method further comprises providing a substrate. The substrate comprises a plurality of first pads corresponding to the leads and second pads corresponding to the enhancement elements. The method further comprises mounting the semiconductor device package to the substrate by first and second solder joints. The first solder joints are disposed between the first pads and the leads. The second solder joints are disposed between the second pads and the enhancement elements. The area of each of the second pads is greater than the area of each of the corresponding enhancement elements.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
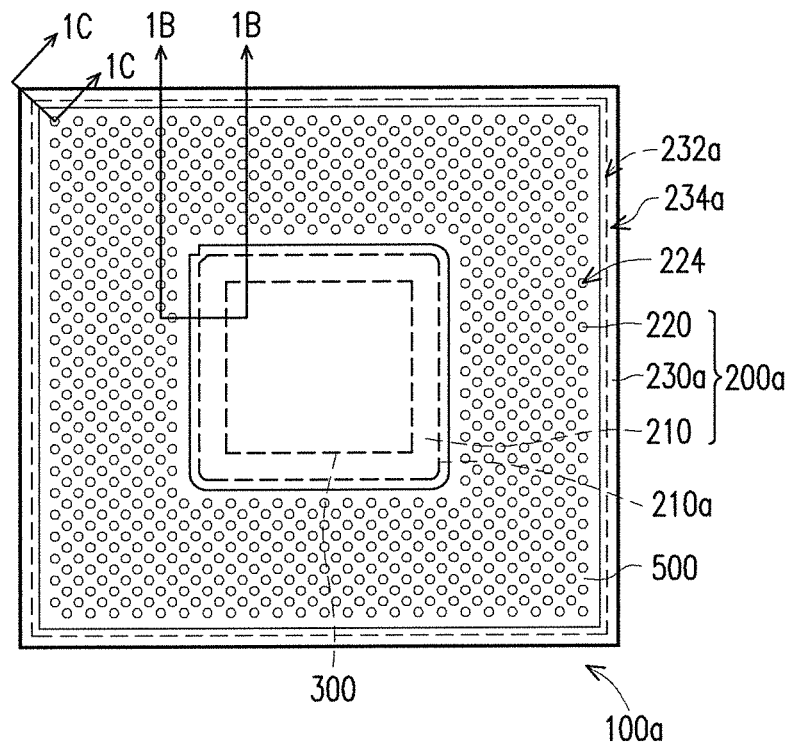
FIG. 1A is a bottom plan view illustrating one embodiment of the present semiconductor device packages.
Figure 1B:
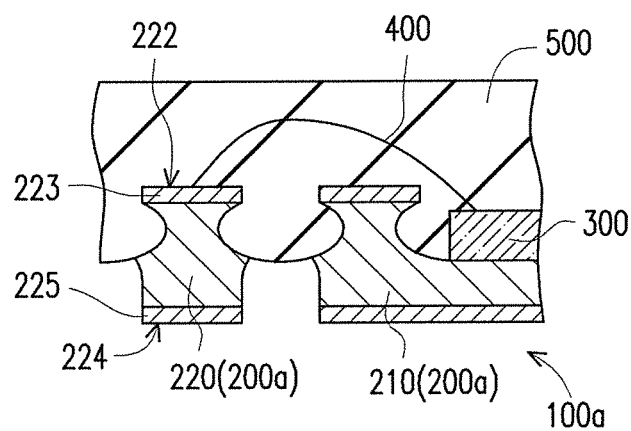
FIG. 1B is a cross-sectional side view of the semiconductor device package of FIG. 1A, taken through the line 1B-1B in FIG. 1A.
Figure 1C:
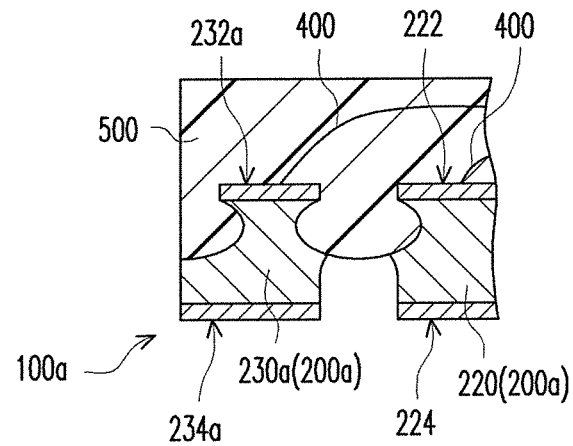
FIG. 1C is a cross-sectional side view of the semiconductor device package of FIG. 1A, taken through the 1C-1C in FIG. 1A.

Referring to FIGS. 1A-1C, a bottom plan view and two cross-sectional side views of a QFN semiconductor device package 100a according to one of the present embodiments is illustrated. The cross-section of the semiconductor device package 100a shown in FIG. 1B is taken along the line 1B-1B in FIG. 1A. The cross-section of the semiconductor device package 100a shown in FIG. 1C is taken along the line 1C-1C in FIG. 1A.

With reference to FIG. 1A, the semiconductor device package 100a includes a carrier 200a, a chip 300, and a molding compound 500. The carrier 200a includes a die pad 210, a plurality of leads 220 and an enhancement element 230a. The die pad 210 has a cavity 210a for disposing the chip 300. The leads 220 are disposed around the die pad 210, in which each lead 220 has a first inner surface 222 (shown in FIG. 1B) and a first outer surface 224 opposite to each other. The enhancement element 230a is disposed around the die pad 210 and continuously circumscribes the outer perimeter of the package 100a, in which the enhancement element 230a has a second inner surface 232a and a second outer surface 234a opposite to each other. A surface area of the second outer surface 234a of the enhancement element 230a is larger than a surface area of the first outer surface 224 of each of the leads 220. Further, a surface area of the second inner surface 232a is smaller than a surface area of the second outer surface 234a. The shapes of the second inner surface 232a and the second outer surface 234a of the enhancement element 230a may both be, for example, annular when viewed in upper or lower plan view.

With reference to FIG. 1B, metal plating layers 223, 225 may be provided on the first inner surface 222 and the first outer surface 224. The metal layers 223, 225 may be formed from titanium/copper (Ti/Cu), nickel/gold (Ni/Au), or other suitable metals, alloys, or sequences of metals and/or alloys, such as, but not limited to Cr/Cr—Cu/Cu, Ti/Ni—V, Ti/Ni—V/Cu, Ti/W, or Ti/W/Au.

With continued reference to FIG. 1B, the chip 300 is disposed on the die pad 210 of the carrier 200a. The semiconductor device package 100a further includes a plurality of bonding wires 400 that electrically connect the chip 300 to the first inner surfaces 222 of the leads 220. The bonding wires 400 may also electrically connect the chip 300 to the die pad 210. The molding compound 500 encapsulates the chip 300, the bonding wires 400, and the first inner surfaces 222 of the leads 220, but leaves exposed the first outer surfaces 224 of the leads 222 and the lower surface of the die pad 210.

With reference to FIG. 1C, as discussed above, the enhancement element 230a has the second inner surface 232a and the second outer surface 234a opposite to each other. The bonding wires 400 may electrically connect the chip 300 to the second inner surface 232a of the enhancement element 230a. The molding compound 500 further encapsulates the second inner surface 232a of the enhancement element 230a, but leaves exposed the second outer surface 234a of the enhancement element 230a.

Figure 1D:
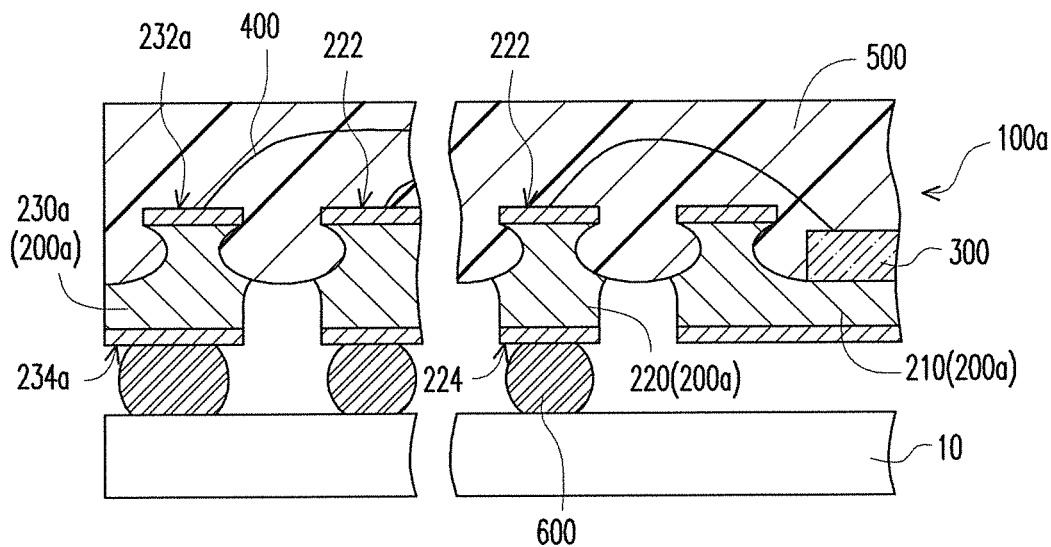
FIG. 1D is a cross-sectional side view the semiconductor device package of FIG. 1A after PCB surface mount.

Referring to FIG. 1D, a cross-sectional side view of the semiconductor device package 100a after PCB surface mount is illustrated. The first outer surfaces 224 of the leads 220 and the second outer surface 234a of the enhancement element 230a are mounted to a PCB 10 by solder 600. Advantageously, since the enhancement element 230a increases the solder contact area and solder capacity so as to enhance the connection strength, it can improve the solder joint reliability between the semiconductor device package 100a and the PCB 10. The solder 600 can be formed on the semiconductor device package 100a by a dip soldering process, a solder printing process, or an electroless plating process, for example, or any other process for PCB surface mount. Alternatively, the solder 600 can be formed on the PCB 10 by a dispensing process, a screen printing process or a stencil printing process, for example, or any other process for PCB surface mount.

Figure 2:
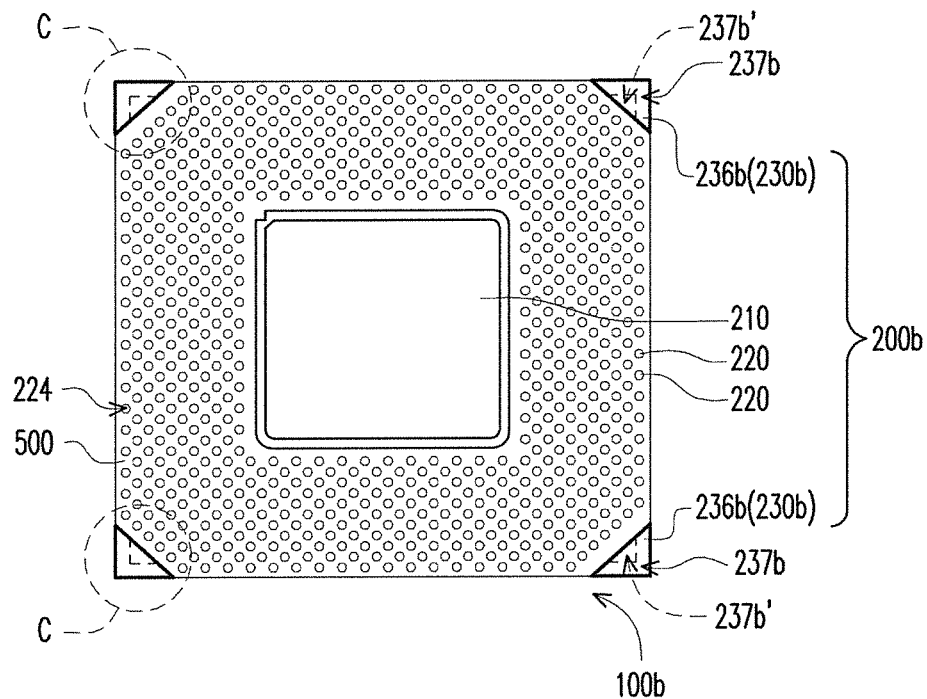
FIG. 2 is a bottom plan view illustrating another embodiment of the present semiconductor device packages.

Referring to FIG. 2, a bottom plan view of a semiconductor device package 100b according to another of the present embodiments is illustrated. The package 100b is similar to the semiconductor device package 100a of FIG. 1A, except that an enhancement element 230b of the package 100b includes a plurality of enhancement element portions 236b. The enhancement element portions 236b are located at the corners C of the carrier 200b, and symmetrically disposed about the die pad 210 as a center. Each enhancement element portion 236b has an outer surface 237b and an inner surface 237b' opposite to each other. The shape of each surface 237b, 237b' is substantially triangular, and edges of the outer surfaces 237b are substantially aligned with lateral edges of the molding compound 500. However, a surface area of each outer surface 237b is larger than a surface area of its corresponding inner surface 237b', so that edges of the inner surfaces 237b' are recessed from, or not substantially aligned with, lateral edges of the molding compound 500. Further, the surface area of each outer surface 237b of each enhancement element portion 236b is larger than a surface area of the first outer surface 224 of each lead 220.

Figure 3:
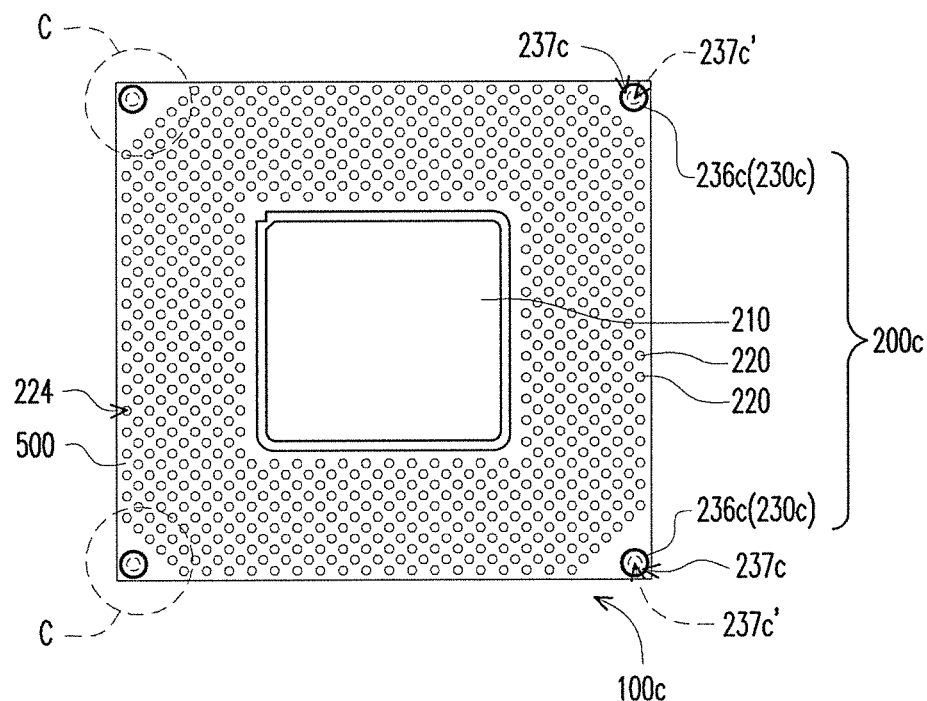
FIG. 3 is a bottom plan view illustrating another embodiment of the present semiconductor device packages.

Referring to FIG. 3, a bottom plan view of a semiconductor device package 100c according to another of the present embodiments is illustrated. The semiconductor device package 100c is similar to the semiconductor device package 100b of FIG. 1B, except that an outer surface 237c and an inner surface 237c' of each enhancement element portion 236c is substantially circular. A surface area of each outer surface 237c is larger than a surface area of each inner surface 237c'. The surface area of the outer surface 237c of each enhancement element portion 236c is larger than the surface area of the first outer surface 224 of each lead 220.

Figure 4:
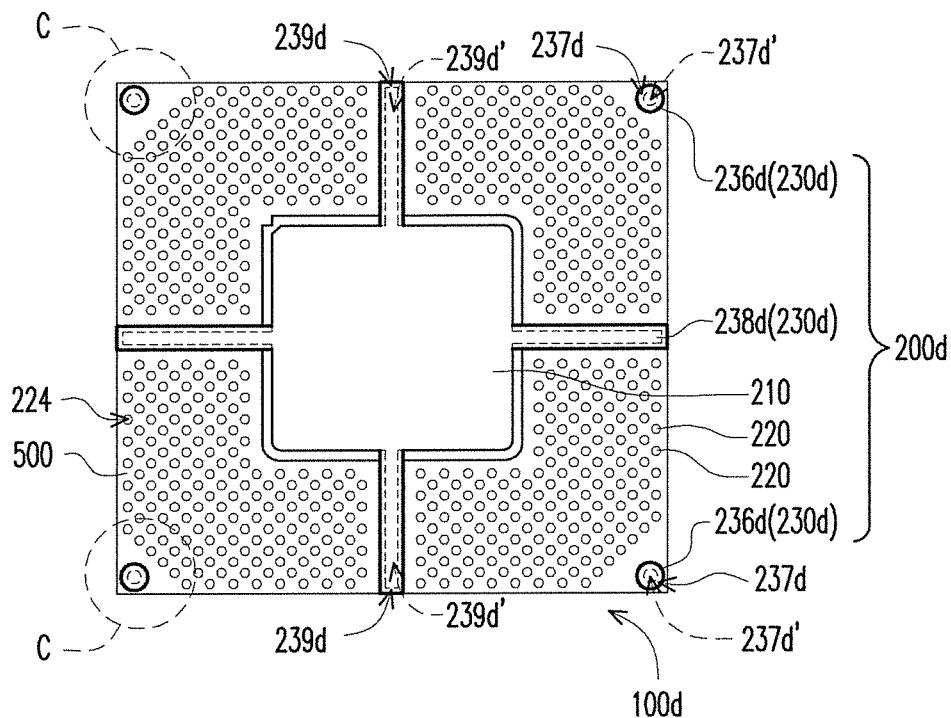
FIG. 4 is a bottom plan view illustrating another embodiment of the present semiconductor device packages.

Referring to FIG. 4, a bottom plan view of a semiconductor device package 100d according to another of the present embodiments is illustrated. The semiconductor device package 100*d* is similar to the semiconductor device package 100*c* of FIG. 3, except that an enhancement element 230*d* of the semiconductor device package 100*d* includes a plurality of first enhancement element portions 236*d* and a plurality of second enhancement element portions 238*d*. The first enhancement element portions 236*d* are similar to the first enhancement element portions 236*c* of FIG. 3. The second enhancement element portions 238*d* are connected to a periphery of the die pad 210 at a center of each edge thereof, symmetrically disposed, and extend to the edges of the carrier 200*d*. Each second enhancement element portion 238*d* has a second outer surface 239*d* and a second inner surface 239*d*' opposite to each other. The shapes of the second outer surfaces 239*d* and the shapes of the second inner surfaces 239*d*' are substantially rectangular, and the surface area of the second outer surface 239*d* of each second enhancement element portion 238*d* is larger than the surface area of the first outer surface 224 of each lead 220.

Figure 5:
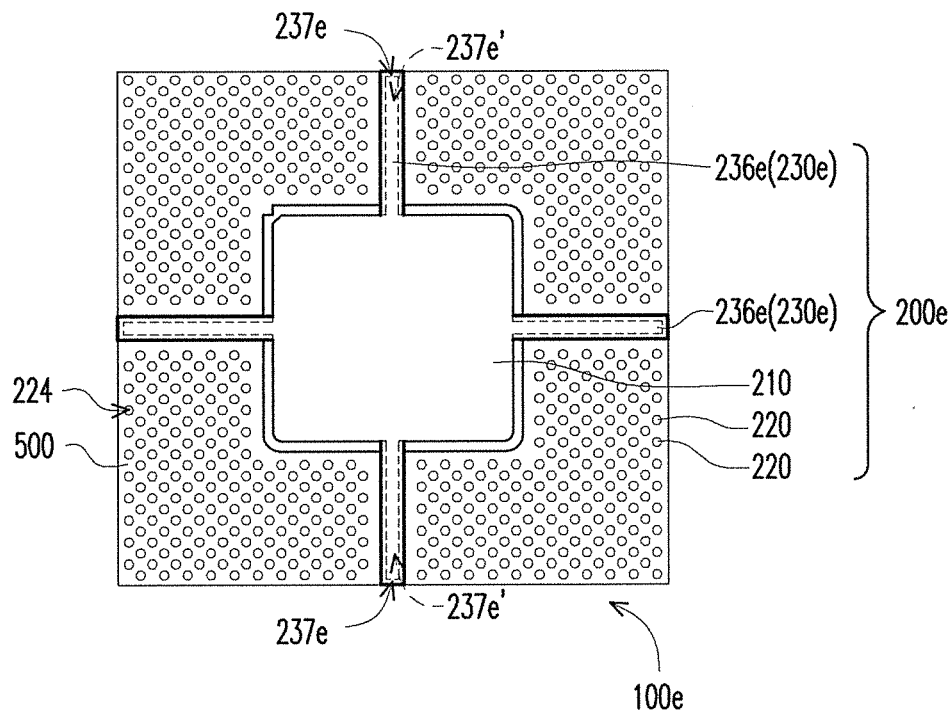
FIG. 5 is a bottom plan view illustrating another embodiment of the present semiconductor device packages.

Referring to FIG. 5, a bottom plan view of a semiconductor device package 100*e* according to another of the present embodiments is illustrated. The semiconductor device package 100*e* is similar to the semiconductor device package 100*d* of FIG. 4, except that the first enhancement element portions 236*d* are omitted.

Figure 6:
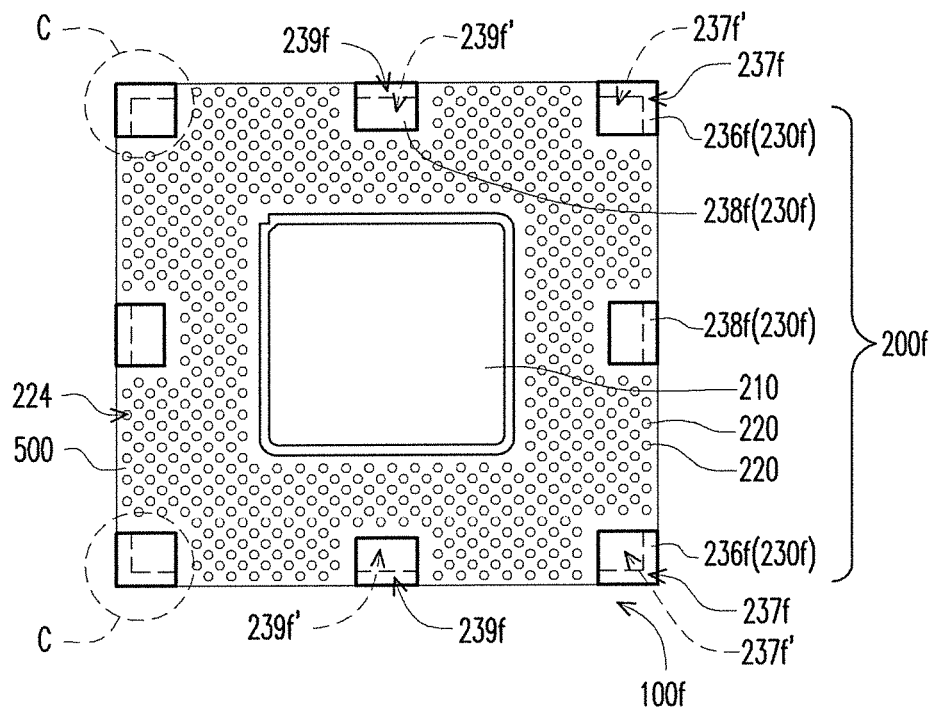
FIG. 6 is a bottom plan view illustrating another embodiment of the present semiconductor device packages.

Referring to FIG. 6, a bottom plan view of a semiconductor device package 100*f* according to another of the present embodiments is illustrated. The semiconductor device package 100*f* is similar to the semiconductor device package 100*a* of FIG. 1A, except that an enhancement element 230*f* of the semiconductor device package 100*f* includes a plurality of first enhancement element portions 236*f* and a plurality of second enhancement element portions 238*f*. The first enhancement element portions 236*f* are located at the corners C of the carrier 200*f*, and symmetrically disposed about the die pad 210 as a center. The second enhancement element portions 238*f* are symmetrically disposed at a center of each edge of the carrier 200*f* with the die pad 210 as a center. Each first enhancement element portion 236*f* has a first outer surface 237*f* and a first inner surface 237*f*' opposite to each other. The shapes of the first outer surfaces 237*f* and the first inner surfaces 237*f*' are substantially rectangular, and edges of the first outer surfaces 237*f* are substantially aligned with lateral edges of a molding compound 500. However, a surface area of each first outer surface 237*f* is larger than a surface area of its corresponding first inner surface 237*f*', so that edges of the first inner surfaces 237*f*' are recessed from, or not substantially aligned with, lateral edges of the molding compound 500. Each second enhancement element portion 238*f* has a second outer surface 239*f* and a second inner surface 239*f*' opposite to each other. The shapes of the second outer surfaces 239*f* and the second inner surfaces 239*f*' are substantially rectangular. Edges of the second outer surfaces 239*f* of the second enhancement element portions 238*f* are substantially aligned with lateral edges of the molding compound 500. However, a surface area of each second outer surface 239*f* is larger than a surface area of its corresponding second inner surface 239*f*', so that edges of the second inner surfaces 239*f*' are recessed from, or not substantially aligned with, lateral edges of the molding compound 500. A surface area of each outer surface 238*f*, 239*f* of each enhancement element portion 238*f*, 239*f* is larger than a surface area of each first outer surface 224 of each lead 220.

In alternative embodiments, the enhancement elements 230*a*, 230*b*, 236*c*, 236*d*, 236*e*, 236*f* may be changed to other forms and/or shapes. However, it is preferred that the surface areas of the second outer surfaces 234*a*, 237*b*, 237*c*, 237*d*, 237*e*, 237*f*, 239*d*, 239*f* of the enhancement elements 230*a*, 230*b*, 236*c*, 236*d*, 236*e*, 236*f* are larger than the surface areas of the first outer surface 224 of each lead 220. The ratio of the surface area of each the outer surfaces of the enhancement elements to the surface area of the outer surface of each the lead is larger than or equal to 4. This configuration can enhance the connection strength and improve the solder joint reliability between the semiconductor device package and the PCB.

Figure 7A:
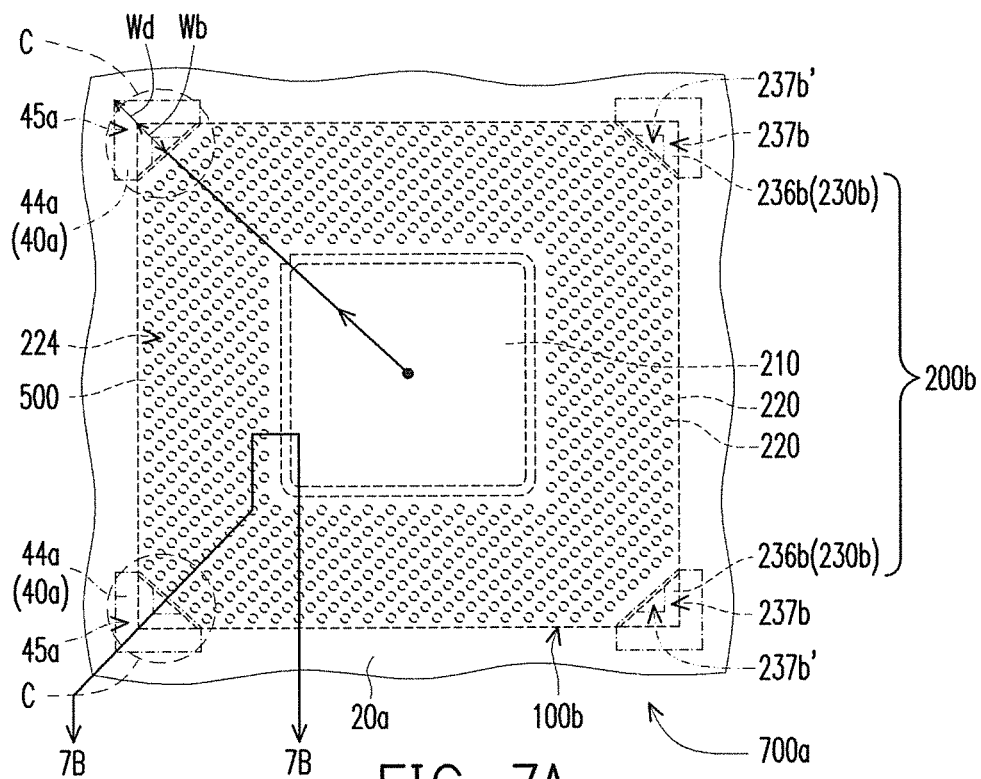
FIG. 7A is a bottom plan view illustrating one embodiment of the present electronic devices.

Referring to FIG. 7A, a bottom plan view of an electronic device 700*a* according to another of the present embodiments is illustrated. The electronic device 700*a* includes the semiconductor device package 100*b* of FIG. 2 and a PCB 20*a*. However, in alternative embodiments, the semiconductor device package 100*b* may be replaced with any other semiconductor device package, such as those 100*a*, 100*d*, 100*e*, 100*f*, 100*g* described above.

The PCB 20*a* includes a plurality of enhancement pads 40*a*, which are located at the corners C of the carrier 200*b*, and are symmetrically disposed about the die pad 210 as a center. Positions of the enhancement pads 40*a* of the PCB 20*a* correspond to positions of the enhancement element portions 236*b* of the semiconductor device package 100*b*. The surface area of each enhancement pad 40*a* is larger than the surface area of the outer surface 237*b* of each first enhancement element portion 236*b*.

Figure 7B:
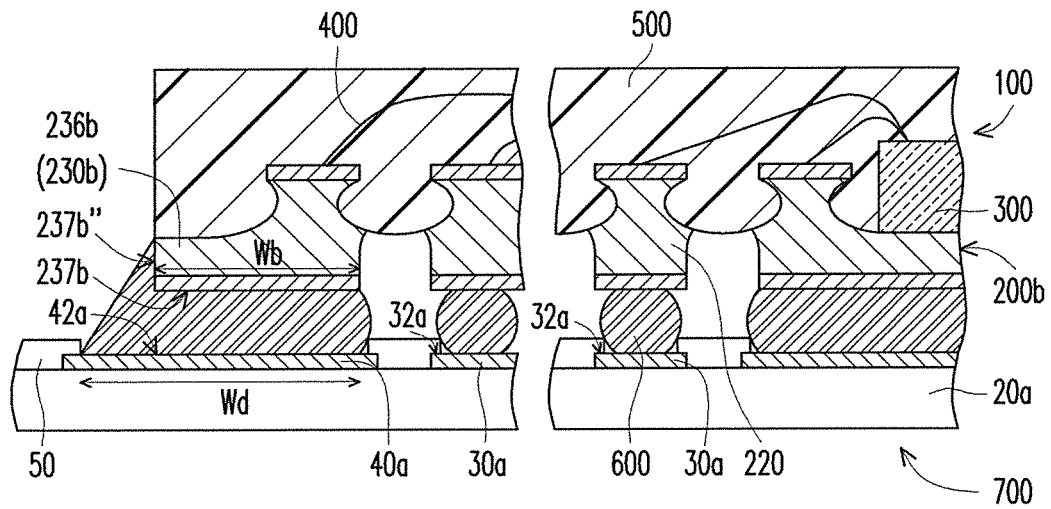
FIG. 7B is a partial cross-sectional side view of the electronic device of FIG. 7A, taken through the line 7B-7B in FIG. 7A.

Referring to FIG. 7B, a partial cross-sectional side view of the electronic device 700*a* of FIG. 7A is illustrated. The PCB 20*a* includes a plurality of bonding pads 30*a*, the enhancement pads 40*a* and a solder mask layer 50. The solder mask layer 50 covers the upper surface of the PCB 20*a* and exposes portions 32*a*, 42*a* of the bonding pads 30*a* and the enhancement pads 40*a*, respectively. The semiconductor device package 100*b* is mounted to the PCB 20*a* by the solder 600.

The surface area of the exposed surface 42*a* of the enhancement pad 40*a* is larger than the surface area of the exposed surface 32*a* of the bonding pad 30*a*. Positions of the bonding pads 30*a* correspond to positions of the leads 220. Positions of the enhancement pads 40*a* correspond to positions of the enhancement elements 230*b*. The enhancement pads 40*a* extend outside the carrier 200*b* of the semiconductor device package 100*b* in the direction away from the chip 300. The exposed surface 42*a* of each enhancement pad 40*a* has a width Wd in the direction away from the chip 300. The outer surface 237*b* of the enhancement element portion 236*b* of the semiconductor device package 100*b* has a width Wb in the same direction, and the ratio (Wd/Wb) is preferably greater than or equal to 1.3.

The solder 600 is disposed between the leads 220 of the semiconductor device package 100*b* and the bonding pads 30*a* of the PCB 20*a*. Although not shown in FIG. 7B, the solder 600 may cover the entire surface of each lead 220 that is exposed from the molding compound 500. The solder 600 is also disposed between the enhancement element portions 236*b* and the enhancement pad portions 44*a*. Since the enhancement pad 40*a* extends outside the enhancement element portions 236*b*, when the ratio (Wd/Wb) is greater than or equal to 1.3, the solder 600 can overflow to contact side surfaces 237*b*" of the enhancement element portions 236*b*. The overflowed solder 600 can provide additional joint strength and improve the solder joint reliability between the semiconductor device package 100*b* and the PCB 20*a* due to the increased contact area between the solder 600 and the package 100.

Figure 8:
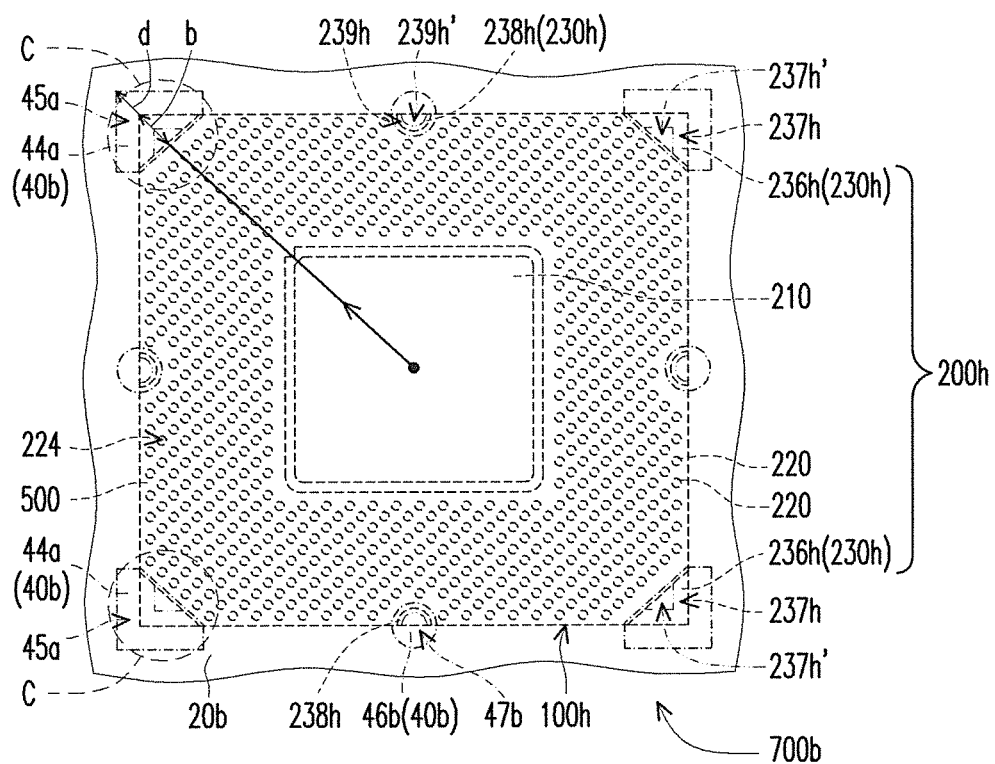
FIG. 8 is a bottom plan view illustrating another embodiment of the present electronic devices.

Referring to FIG. 8, a bottom plan view of an electronic device 700*b* according to another of the present embodiments is illustrated. The electronic device 700*b* is similar to the electronic device 700*a* of FIG. 7A, except that an enhancement pad 40b of a PCB 20b includes a plurality of first and second enhancement pad portions 45a, 46b. An enhancement element 230h of a carrier 200h of a semiconductor device package 100h includes a plurality of first and second enhancement element portions 236h, 238h.

The first enhancement element portions 236h are located at the corners C of the carrier 200h and symmetrically disposed about the die pad 210 as a center. The second enhancement element portions 238h are symmetrically disposed at centers of the edges of the carrier 200h with the die pad 210 as a center. The shapes of the outer surfaces 237h and the inner surfaces 237h' of the first enhancement element portions 236h are substantially triangular. The shapes of the outer surfaces 239h and the inner surfaces 239h' of the second enhancement element portions 238h are substantially semicircular.

Positions of the second enhancement pad portions 46b correspond to positions of the second enhancement element portions 238h. A surface area of the exposed surface of the second enhancement pad portion 46b is larger than a surface area of the outer surface 239h of the second enhancement element portion 238h. In addition, the edges of the outer surfaces 239h of the second enhancement element portions 238h are substantially aligned with the lateral edges of the molding compound 500. Positions of the first and second enhancement pad portions 45a, 46b correspond to positions of the first and second enhancement element portions 236h, 238h. The first and second enhancement pad portions 45a, 46b extend outside the carrier 200h of the semiconductor device package 100h in the direction away from the chip 300. The surface area of the exposed surfaces of first and second enhancement pad portions 45a, 46b are larger than the surface area of the outer surfaces the first and second enhancement element portions 236h, 238h respectively. This configuration allows the solder 600 to overflow to the side surfaces of the first and second enhancement element portions 236h, 238h. The overflowed solder 600 can provide additional joint strength and improve the solder joint reliability between the semiconductor device package 100h and the PCB 20b due to the increased contact area between the solder 600 and the package 100h.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An electronic device, comprising:
   a semiconductor device package including
      a die pad;
      a plurality of leads disposed about the die pad, each lead including a first outer surface;
      a plurality of enhancement elements disposed about the die pad adjacent to edges of the semiconductor device package, each enhancement element including a second outer surface, a surface area of the second outer surface being larger than a surface area of the first outer surface;
      a chip disposed on the die pad and electrically connected to the leads;
      a package body encapsulating the chip, at least portions of the leads, and at least portions of the enhancement elements; and
   a substrate, the substrate including a plurality of first pads corresponding to the leads and a plurality of second pads corresponding to the enhancement elements, a plurality of first solder joints disposed between the first pads and the leads, and a plurality of second solder joints disposed between the second pads and the enhancement elements;
   wherein a surface area of each of the second pads is larger than a surface area of a corresponding one of the enhancement elements.

2. The electronic device of claim 1, wherein the first outer surface and the second outer surface are at least partially exposed from the package body.

3. The electronic device of claim 1, wherein the second outer surface has a substantially circular shape.

4. The electronic device of claim 1, wherein the second outer surface has a substantially triangular shape.

5. The electronic device of claim 4, wherein the enhancement element has three side surfaces with at least one of the side surfaces exposed.

6. The electronic device of claim 1, wherein the second outer surface has a substantially rectangular shape.

7. The electronic device of claim 6, wherein the enhancement element has four side surfaces with at least one of the side surfaces exposed.

8. The electronic device of claim 1, wherein the enhancement element is disposed at a corner of the package body.

9. The electronic device of claim 1, wherein the enhancement elements are disposed at a center of each edge of the package body.

10. The electronic device of claim 1, wherein the enhancement elements connect to the die pad and extend to an edge of the semiconductor device package.

11. The electronic device of claim 1, wherein a ratio of a width of each of the second pads to a width of each of the enhancement elements is greater than or equal to 1.3.

12. The electronic device of claim 1, wherein the enhancement elements have at least three side surfaces with at least one of the side surfaces exposed, and the second solder joints contact the exposed side surface.

13. The electronic device of claim 1, further comprising a solder mask layer covering portions of the substrate, but leaving the first and second pads exposed.

14. The electronic device of claim 1, wherein the enhancement elements are symmetrically disposed about the die pad as a center.

15. The electronic device of claim 1, further comprising metal plating layers on the outer surfaces of the enhancement elements.

16. The electronic device of claim 15, wherein the metal plating layers comprise materials selected from at least one of titanium/copper (Ti/Cu), nickel/gold (Ni/Au), Cr/Cr—Cu/Cu, Ti/Ni—V, Ti/Ni—V/Cu, Ti/W, and Ti/W/Au.

\* \* \* \* \*